(12) United States Patent
Wang et al.

(10) Patent No.: US 9,152,215 B2
(45) Date of Patent: Oct. 6, 2015

(54) POWER CONTROL CIRCUIT AND ELECTRONIC DEVICE

(71) Applicants: AMBIT MICROSYSTEMS (SHANGHAI) LTD., Shanghai (CN); HON HAI PRECISION INDUSTRY CO., LTD., New Taipei (TW)

(72) Inventors: Gen Wang, Shanghai (CN); Jin Liu, Shanghai (CN)

(73) Assignees: AMBIT MICROSYSTEMS (SHANGHAI) LTD., Shanghai (CN); HON HAI PRECISION INDUSTRY CO., LTD., New Taipei (TW)

( * ) Notice: Subject to any disclaimer, the term of this patent is extended or adjusted under 35 U.S.C. 154(b) by 28 days.

(21) Appl. No.: 13/972,855

(22) Filed: Aug. 21, 2013

(65) Prior Publication Data

US 2014/0203862 A1   Jul. 24, 2014

(30) Foreign Application Priority Data

Jan. 21, 2013   (CN) .......................... 2013 1 0021025

(51) Int. Cl.
| | | |
|---|---|---|
| *H03K 17/687* | (2006.01) | |
| *G06F 1/32* | (2006.01) | |
| *H03K 17/10* | (2006.01) | |

(52) U.S. Cl.
CPC .............. *G06F 1/3246* (2013.01); *H03K 17/10* (2013.01); *H03K 17/687* (2013.01); *H03K 2217/0054* (2013.01)

(58) Field of Classification Search
None
See application file for complete search history.

(56) References Cited

U.S. PATENT DOCUMENTS

| | | | | | |
|---|---|---|---|---|---|
| 4,705,962 | A | * | 11/1987 | Kinoshita et al. .............. | 327/381 |
| 5,739,710 | A | * | 4/1998 | Baik .............................. | 327/173 |
| 6,072,342 | A | * | 6/2000 | Haider et al. .................. | 327/112 |
| 7,151,401 | B2 | * | 12/2006 | Inoue ............................. | 327/434 |
| 7,898,301 | B2 | * | 3/2011 | Phillips et al. .................. | 327/77 |
| 8,803,561 | B2 | * | 8/2014 | Imanishi et al. .............. | 327/108 |
| 2005/0017752 | A1 | * | 1/2005 | Kim ................................. | 326/8 |
| 2012/0154007 | A1 | | 6/2012 | Imanishi et al. | |

FOREIGN PATENT DOCUMENTS

| | | |
|---|---|---|
| TW | 200951702 A | 12/2009 |
| TW | M405680 U1 | 6/2011 |

\* cited by examiner

*Primary Examiner* — Tuan T Lam
(74) *Attorney, Agent, or Firm* — Novak Druce Connolly Bove + Quigg LLP

(57) ABSTRACT

A basic and simple power control circuit for selectively controlling power to an electronic device is provided. The electronic device includes a power module, a system power port, and a processing unit, the processing unit includes a first and a second power control pins. The power control circuit includes a power switch, a trigger signal producing sub-circuit, a trigger-receiving sub-circuit, and a switch controlling sub-circuit. The switch is connected between the power module and the system power port. The trigger signal producing sub-circuit produces a trigger signal. When receiving a trigger signal, the trigger-receiving sub-circuit follows a first control signal output by the second power control pin to output the first control signal. The switch controlling sub-circuit turns off the power switch when receiving the first control signal.

15 Claims, 3 Drawing Sheets

POWER CONTROL CIRCUIT AND ELECTRONIC DEVICE

BACKGROUND

1. Technical Field

The present disclosure relates to circuits, and particularly to a power control circuit and an electronic device with the power control circuit.

2. Description of Related Art

Electronic devices, such as computers, set-top boxes, include a power control circuit. When the electronic device is manually shut down, the power control circuit cuts off the power source after the electronic device is given a soft shutdown. The usual power control circuit also can control the electronic device to enter an active standby mode or a passive standby mode awaiting further user operation. In the active standby mode, the power control circuit maintains power to every element of the electronic device, and only shuts down programs currently running. In the passive standby mode, the power control circuit stops providing power to the elements of the electronic device except for a central processing unit and a memory of the electronic device, to maintain basic operating requirements. However, the usual power control circuit is constituted by a microcontroller and a power management chip and is expensive.

A power control circuit and an electronic device to overcome the described limitations are thus needed.

BRIEF DESCRIPTION OF THE DRAWINGS

Many aspects of the present disclosure are better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION

Embodiments of the present disclosure will be described with reference to the accompanying drawings.

Figure 1:
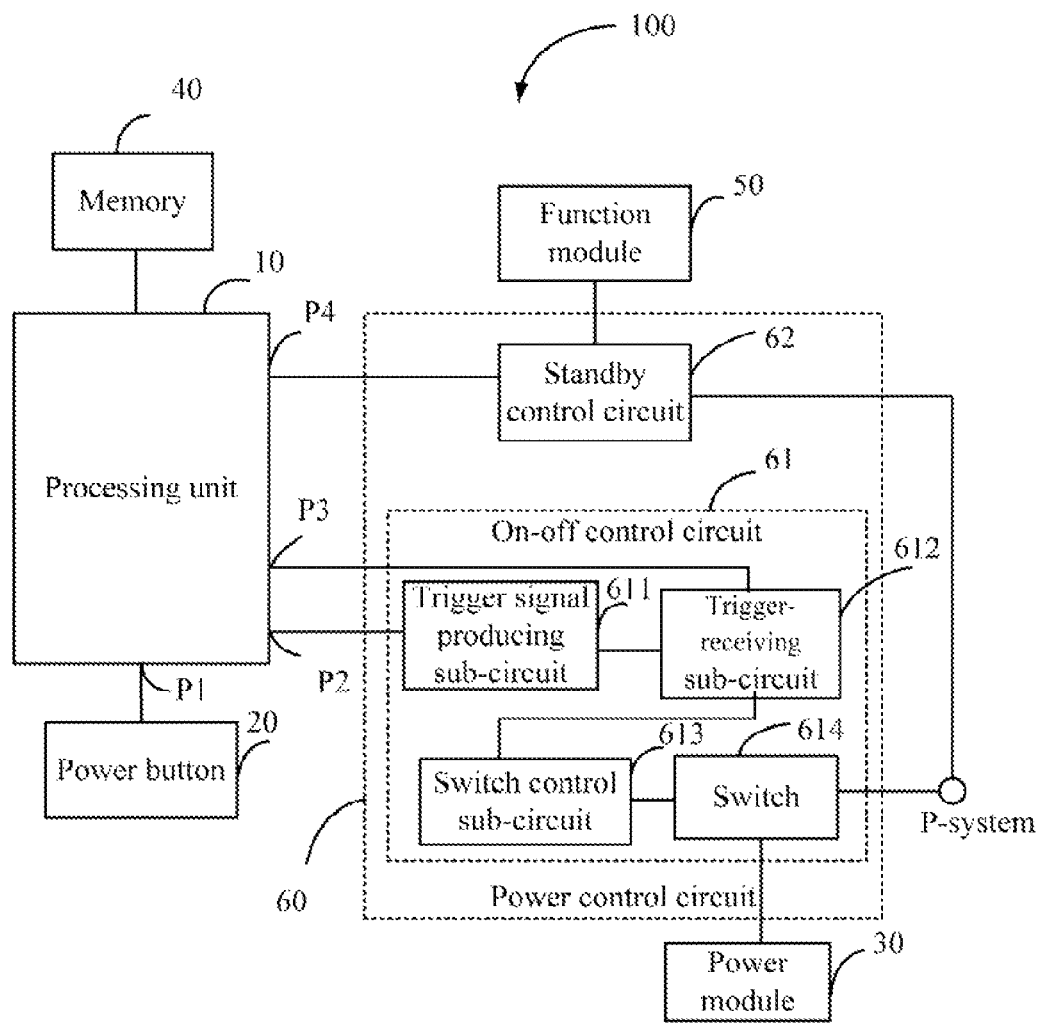
FIG. 1 is a block diagram of an embodiment of an electronic device with a power control circuit.

FIG. 1 illustrates a block diagram of an embodiment of an electronic device 100. The electronic device 100 includes a processing unit 10, a power button 20, a power module 30, a memory 40, a function module 50, a power control circuit 60, and a system power port P-system. The electronic device 100 is capable of managing the power of the power module 30 by using the power control circuit 60 with a simple structure.

The power button 20 produces a signal in response to user operation. The power module 30 powers the electronic device 100 via the system power port P-system. The power module 30 can be a battery or a power adapter.

The processing unit 10 includes a receive pin P1, a first on-off control pin P2, and a second on-off control pin P3. The processing unit 10 receives the signal produced by the power button 20 via the receive pin P1.

The power control circuit 60 includes an on-off control circuit 61. The on-off control circuit 61 includes a trigger signal producing sub-circuit 611, a trigger-receiving sub-circuit 612, a switch control sub-circuit 613, and a switch 614. The trigger signal producing sub-circuit 611 is connected to the first on-off control pin P2. The trigger-receiving sub-circuit 612 is connected to the second on-off control pin P2 and the trigger signal producing sub-circuit 611. The switch control sub-circuit 613 is connected between the trigger-receiving sub-circuit 612 and the switch 614. The switch 614 is connected between the power module 30 and the system power port P-system, and establishes or cuts off a connection between the power module 30 and the system power port P-system. The system power port P-system is a total power input port for the electronic device.

In the embodiment, when the processing unit 10 determines that a duration of the signal from the power button 20 is greater than a first predetermined time (such as 4 seconds) and the electronic device 100 is at a normal working state, the processing unit 10 controls the first on-off control pin P2 and a second on-off control pin P3 to both output a first control signal, and controls the electronic device 100 to carry out a soft shutdown, namely to store user data and then shut down running programs. The processing unit 10 also controls the first on-off control pin P2 to output a second control signal after the soft shutdown is finished. The trigger signal producing sub-circuit 611 produces an edge trigger signal in response to the signals output by the first on-off control pin P2 is changed from the first control signal to the second control signal. The trigger-receiving sub-circuit 612 follows the first control signal output by the second on-off control pin P3 and then issues out the first control signal, when receiving the edge trigger signal from the trigger signal producing sub-circuit 611. The switch control sub-circuit 613 turns off the switch 614 when receiving the first control signal from the trigger-receiving sub-circuit 612, thus cutting off the connection between the power module 30 and the system power port P-system. Then, the electronic device 100 is shut down completely. In the embodiment, the processing unit 10 controls the second on-off control pin P3 to output the first control signal all the time before the electronic device 100 is shut down completely.

In the embodiment, the power control circuit 60 also includes a standby control circuit 62 connected between the system power port P-system and the function module 50.

The processing unit 10 also includes a standby control pin P4. The processing unit 10 controls the standby control pin P4 to output a standby control signal to the standby control circuit 62, when it is determined that the duration of the signal from the power button 20 is less than the first predetermined time but is greater than a second predetermined time (such as 2 seconds) and that the electronic device 100 is working normally. The standby control circuit 62 cuts off a connection between the system power port P-system and the function module 50 when receiving the standby control signal. Thus the system power port P-system stops providing power to the function module 50 and the electronic device 100 enters a passive standby mode. In the passive standby mode, the function module 50 is not in working state due to power supply being cut off. In the embodiment, the function module 50 includes all of function chips of the electronic device 100 except the processing unit 10 and the memory 40, such as a codec chip, an audio processing chip, and the like.

Therefore, when the electronic device 100 is at the passive standby state, only the processing unit 10 and the memory 40 are being powered, and the other elements of the electronic device 100 are not powered, which greatly decreases power consumption. In the embodiment, the system power port P-system is connected to the processing unit 10 and the memory 40 directly and is always powering the processing unit 10 and the memory 40 when the system power port P-system obtains power from the power module 30.

In the embodiment, the processing unit 10 controls the electronic device to enter an active standby state when determining that the duration of the signal from the power button 20 is less than the second predetermined time and that the electronic device 100 is working normally. When the electronic device 100 at the active standby state, the processing unit 10 shuts down the programs running currently and provides power to the function module 50.

In the embodiment, the processing unit 10 also controls the electronic device 100 to resume a normal working state when determining that the duration of the signal from the power button 20 is less than the second predetermined time and that the electronic device 100 is at the active standby mode or at the passive standby mode.

In the embodiment, the processing unit 10 also controls the electronic device 100 to enter the active standby mode when determining that the electronic device 100 is turned on and that a duration of time during which no operations are carried out on the electronic device 100 is at least a third predetermined time, such as 1 hour.

Figure 2:
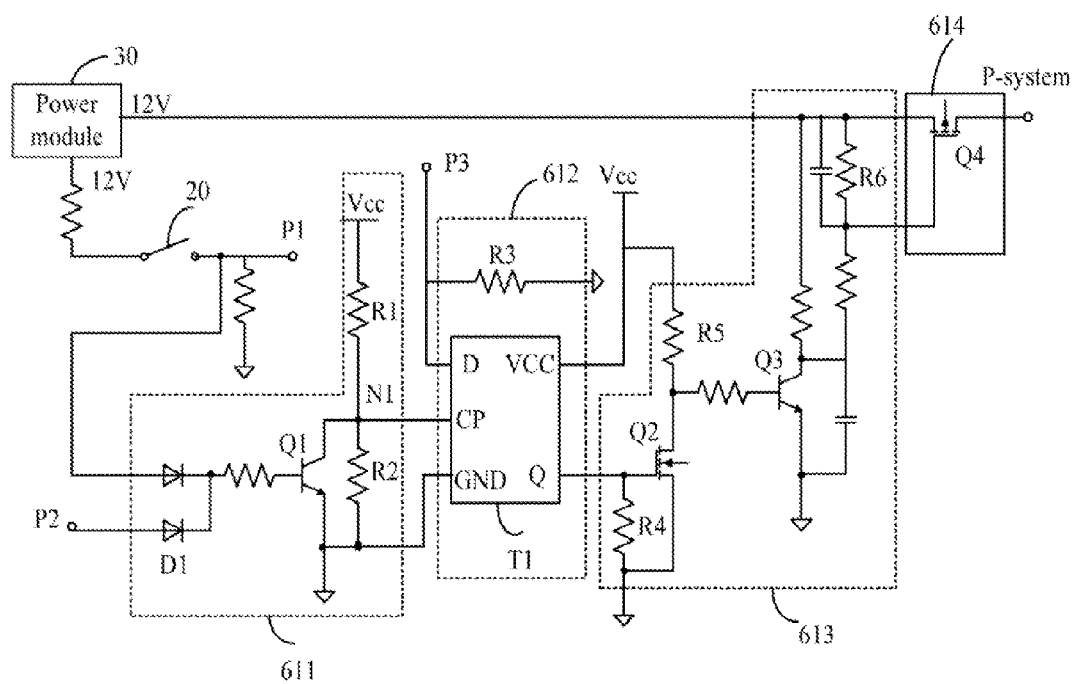
FIG. 2 is a circuit diagram of an embodiment of an on-off controlling circuit of a power control circuit.

Referring to FIG. 2, a circuit diagram of the on-off control circuit 61 is illustrated. In the circuit, the trigger signal producing sub-circuit includes resistors R1, R2, a diode D1, and a negative-positive-negative bipolar junction transistor (NPN BJT) Q1. The resistors R1 and R2 are connected between a voltage port Vcc and ground in series. A connection node N1 of the resistors R1 and R2 constitutes an output port (not shown) of the trigger signal producing sub-circuit 611. The diode D1 is connected between the first on-off control pin P1 and a base of the NPN BJT Q1, an emitter of the NPN BJT Q1 is grounded, and a collector of the BPN BJT Q1 is connected to the connection node N1.

The voltage port Vcc obtains a voltage by virtue of being connected to the power module 30.

The trigger-receiving sub-circuit 612 includes a resistor R3 and a D-flip flop T1. The D-flip flop T1 includes an input terminal D, an output terminal Q, and a trigger terminal CP. The input terminal D is connected to the second on-off control pin P3, the trigger terminal CP is connected to the output port of the trigger signal producing sub-circuit 611, namely, to the connection node N1 of the resistors R1 and R2. The resistor R3 is connected between the input terminal D and ground. The output terminal Q is connected to the switch control sub-circuit 613.

The switch control sub-circuit 613 includes resistors R4, R5, R6, an N-channel metal oxide semiconductor field effect transistor (NMOSFET) Q2, and an NPN BJT Q3. A gate of the NMOSFET Q2 is connected to the output terminal Q of the D-flip flop T1 and is grounded via the resistor R4. The resistor R5 is connected between the voltage port Vcc and a drain of the NMOSFET Q2, a source of the NMOSFET Q2 is grounded. The drain of the NMOSFET Q2 is also connected to a base of the NPN BJT Q3, an emitter of the NPN BJT Q3 is grounded. The resistor R6 is connected between the power module 30 and a collector of the NPN BJT Q3.

In the embodiment, the switch 614 is a P-channel metal oxide semiconductor field effect transistor (PMOSFET) Q4, a source and a gate of the PMOSFET Q4 are connected to two ends of the resistor R6, a drain of the PMOSFET Q4 is connected to the system power port P-system. The source of the PMOSFET Q4 is also connected to the power module 30.

In the embodiment, the power button 20 is connected between the power module 30 and the receive pin P1 of the processing unit 10. In the embodiment, the signal from the power button 20 is a high level signal, when the power button 20 is being operated/pressed, the power button 20 connects the power module 30 and the receive pin P1, thus the receive pin P1 receives the signal with high level voltage. In the embodiment, the power button 20 is a reset switch.

As described above, when the processing unit 10 determines that the duration of the power button 20 signal is greater than the first predetermined time and the electronic device 100 is working normally, the processing unit 10 controls the first on-off control pin P2 and the second on-off control pin P3 to both output the first control signal. The processing unit 10 controls the electronic device to carry out a soft shut down at this time. The processing unit 10 also controls the second on-off control pin P3 to output the second control signal and maintains the first on-off control pin P2 to output the first control signal, after a soft shutdown of the electronic device 10 has taken place. In the embodiment, the first control signal is a high level signal, the second control signal is a low level signal, and the D-flip flop T1 is a rising-edge triggered flip flop.

When the first on-off control pin P2 outputs the first control signal with high level voltage, a base of the NPN BJT Q1 electrically connected to the first on-off control pin P2 obtains the high level signal and the NPN BJT Q1 is turned on accordingly. The trigger terminal CP of the D-flip flop T1 is grounded via the turned-on NPN BJT Q1 and is at a low level voltage. When the first on-off control pin P2 outputs the second control signal with the low level voltage, the NPN BJT Q1 is turned off because of the base of the NPN BJT Q1 receives a low level voltage. The connection node N1 of the resistors R1 and R2 is at high level voltage by dividing the voltage of the voltage port Vcc. Thus, the trigger terminal CP of the D-flip flop T1 receives the high level voltage from the connection node N1 and is at high level voltage. Therefore, the trigger signal producing sub-circuit 611 outputs a rising-edge trigger signal to the trigger terminal CP of the D-flip flop T1.

The output terminal Q of the D-flip flop T1 follows the signal of the input terminal D when the trigger terminal CP of the D-flip flop T1 receives the rising-edge trigger signal. That is, the output terminal Q of the D-flip flop T1 outputs the first control signal when the trigger terminal CP of the D-flip flop T1 receives the rising-edge trigger signal.

The gate of the NMOSFET Q2 of the switch control sub-circuit 613 receives the first control signal with the high level voltage and the NMOSFET Q2 is turned on accordingly. The base of the NPN BJT Q3 is grounded via the NMOSFET Q2 which is turned on and the NPN BJT Q3 is turned off accordingly.

The gate of the PMOSFET Q4 is electrically connected to the power module 30 and is at high level voltage via the resistor R3, thus the PMOSFET Q4 is turned off. The connection between the power module 30 and the system power port P-system is cut off, thus none of elements of the electronic device 100 receive any power and the electronic device 100 is turned off completely.

As shown in FIG. 2, the trigger signal producing sub-circuit 611 also includes a diode D2, the diode D2 is connected between the receive pin P1 and the base of the NPN BJT Q1. Therefore, when the power button 20 is operated, the diode D2 also conducts the high level voltage to the base of the NPN BJT Q1, and when the pressing of the power button 20 is stopped, the diode D2 does not conduct a high level voltage to the base of the NPN BJT Q2. Therefore, if the power button 20 is released after the first on-off control pin outputs the second control signal with the low level voltage, the time that the trigger signal producing sub-circuit 611 outputs the rising-edge trigger signal is the time the power button 20 is released. Of course, if the power button 20 is released before the first on-off control pin outputs the second control signal with the low level voltage, the time that the trigger signal producing sub-circuit 611 outputs the rising-edge trigger signal is the time that the first on-off control pin outputs the second control signal. In another embodiment, the diode D2 can be omitted, and the output time for the trigger signal producing sub-circuit 611 outputting the rising-edge trigger signal is the time that the first on-off control pin outputs the second control signal.

Figure 3:
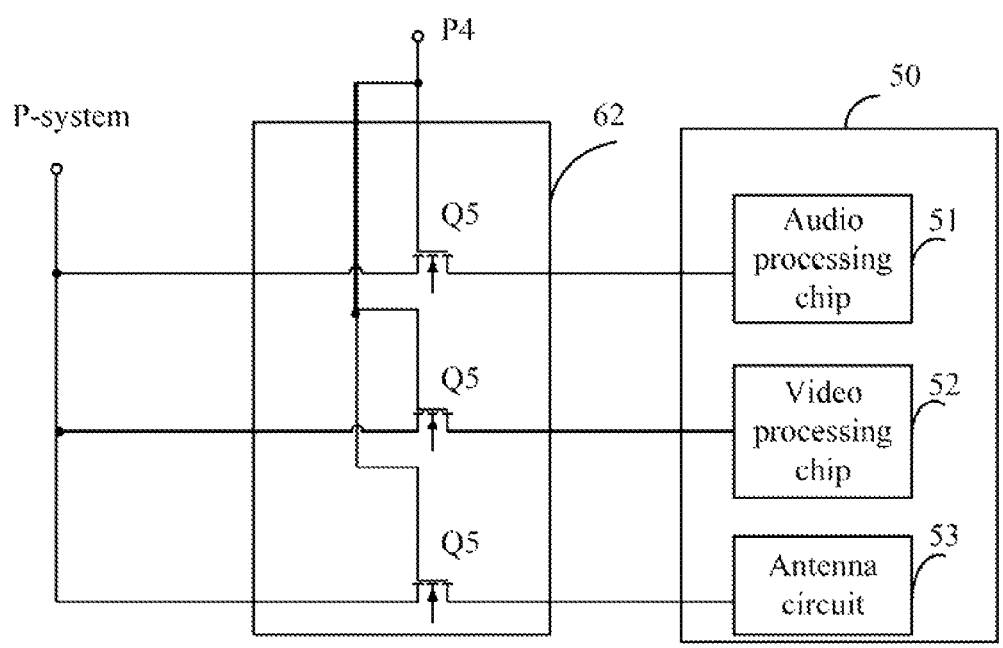
FIG. 3 is a circuit diagram of an embodiment of an standby controlling circuit of a power control circuit.

Referring to FIG. 3, a circuit diagram of the standby control circuit 62 is illustrated. In the embodiment, the standby control circuit 62 includes a number of MOSFETs Q5, the function module 50 includes a number of function chips, such as an audio processing chip 51, a video processing chip 52, and an antenna circuit 53. Gates of the MOSFETs Q5 are all connected to the standby control pin P4 of the processing unit 10, sources of the MOSFETs Q5 are all connected to the system power port P-system, and drains of the MOSFETs Q5 are respectively connected to the audio processing chip, the video processing chip, and the antenna circuit 53.

As described above, when the processing unit 10 determines that the duration of the signal from the power button 20 is less than the first predetermined time but greater than the second predetermined time and that the electronic device 100 is working normally, the processing unit 10 controls the standby control pin P4 to output the standby control signal to the gate of each MOSFET Q5, to turn off each of the MOSFETs Q5. Therefore, the connection between the system power port P-system and the function module 50 is cut off and the system power port P-system stops providing power to the function module 50.

In the embodiment, the MOSFETs Q5 are NMOSFETS, and the standby control signal is a low level signal. In another embodiment, the MOSFETs Q5 are PMOSFETS, and the standby control signal is a high level signal.

In the embodiment, when the processing unit 10 determines that the duration of the signal from the power button 20 is less than the second predetermined time and the electronic device 100 is at the active standby mode or at the passive standby mode, the processing unit 10 controls the standby control pin P4 to output a high level signal to the gates of the MOSFETs Q5, to turn on each of the MOSFETs Q5. Thus, the system power port P-system resumes a power supply to the function module 50.

In the embodiment, the electronic device 100 can be a notebook computer, a tablet computer, a desktop computer, or a set top box.

Therefore, the very simple power control circuit 60 can control the electronic device 100 to turn on or turn off, or to switch between different standby modes and the normal working mode.

It is understood that the present embodiments and their advantages will be understood from the foregoing description, and various changes may be made thereto without departing from the spirit and scope of the disclosure or sacrificing all of its material advantages, the examples hereinbefore described merely being embodiments of the present disclosure.

What is claimed is:

1. A power control circuit for controlling power of an electronic device, the power control circuit comprising:
   an on-off control circuit comprising:
      a switch to be connected between a power module and a system power port of the electronic device;
      a trigger signal producing sub-circuit to be connected to a first on-off control pin of a processing unit of the electronic device, wherein the trigger signal producing sub-circuit comprises a transistor, and the transistor configured to produce an edge trigger signal in response to a signal output by the first on-off control pin is changed from a first control signal to a second control signal;
      a trigger-receiving sub-circuit to be connected to a second on-off control pin of the processing unit of the electronic device and the trigger signal producing sub-circuit, configured to follow a signal output by the second on-off control pin and then output the signal of the second on-off control pin when receiving the edge trigger signal from the trigger signal producing sub-circuit, wherein, the second on-off control pin outputs the first control signal, and the trigger-receiving sub-circuit outputs the first control signal when receiving the edge trigger signal;
      a switch control sub-circuit connected between the trigger-receiving sub-circuit and the switch, configured to turn off the switch when receiving the first control signal from the trigger-receiving sub-circuit; and
   a standby control circuit to be connected between the system power port, a function module of the electronic device, and a standby control pin of the processing unit;
   wherein the standby control circuit is configured to cut off a connection between the system power port and the function module when receiving a standby control signal from the standby control pin.

2. The power control circuit according to claim 1, wherein the trigger signal producing sub-circuit further comprises a first resistor, a second, and a diode D1, the first resistor and the second resistor are connected between a voltage port and ground in series; the transistor is a negative-positive-negative bipolar junction transistor (NPN BJT), the diode is connected between the first on-off control pin and a base of the NPN BJT, an emitter of the NPN BJT is grounded, and a collector of the NPN BJT is connected to a connection node of the first resistor and the second resistor.

3. The power control circuit according to claim 2, wherein the trigger-receiving sub-circuit comprises a third resistor and a D-flip flop, the D-flip flop comprises an input terminal, an output terminal, and a trigger terminal, the input terminal is connected to the second on-off control pin, the trigger terminal is connected to the connection node of the first resistor and the second resistor, and the third resistor is connected between the input terminal and ground.

4. The power control circuit according to claim 3, wherein the switch control sub-circuit comprises a fourth resistor, a fifth resistor, a sixth resistor, a N-channel metal oxide semiconductor field effect transistor (NMOSFET), and a second NPN BJT; a gate of the NMOSFET is connected to the output terminal of the D-flip flop and is grounded via the fourth resistor, the fifth resistor is connected between the voltage port and a drain of the NMOSFET, a source of the NMOSFET is grounded; the drain of the NMOSFET is further connected to a base of the second NPN BJT, an emitter of the second NPN BJT is grounded, the sixth resistor is connected between the power module and a collector of the second NPN BJT.

5. The power control circuit according to claim 4, wherein the switch is a P-channel metal oxide semiconductor field effect transistor (PMOSFET), a source and a gate of the PMOSFET are connected to two ends of the sixth resistor, a drain of the PMOSFET is connected to the system power port, the source of the PMOSFET is further connected to the power module.

6. The power control circuit according to claim 1, wherein the standby control circuit comprises a plurality of MOSFETs; Gates of the MOSFETs are all connected to the standby control pin of the processing unit, sources of the MOSFETs are all connected to the system power port, and drains of the MOSFETs are connected to function chips of the function module one by one.

7. An electronic device for indicating status, comprising:
a power button configured to produce a signal in response to user operation;
a system power port;
a power module configured to provide power to the electronic device via the system power port;
a function module;
a processing unit comprising a receive pin, a first on-off control pin, and a second on-off control pin; wherein, the processing unit receives the signal produced by the power button via the receive pin, the processing unit controls the first on-off control pin and a second on-off control pin both to output a first control signal and controls the electronic device to be soft shutdown when determining that a duration of the key from the power button is greater than a first predetermined time and the electronic device is at a normal work state; the processing unit further controls the first on-off control pin to output a second control signal after the soft shutdown is finished; and
a power control circuit comprising an on-off control circuit, the on-off control circuit comprising:
a switch to be connected between the power module and the system power port;
a trigger signal producing sub-circuit connected to the first on-off control pin of a processing unit, configured to produce an edge trigger signal in response to the first control signal output by the first on-off control pin is changed to the second control signal;
a trigger-receiving sub-circuit connected to the second on-off control pin of the processing unit and the trigger signal producing sub-circuit, configured to follow the first control signal output by the second on-off control pin and then output the first control signal when receiving the edge trigger signal from the trigger signal producing sub-circuit;
a switch control sub-circuit connected between the trigger-receiving sub-circuit and the switch, configured to turn off the switch when receiving the first control signal from the trigger-receiving sub-circuit.

8. The electronic device according to claim 7, wherein the trigger signal producing sub-circuit comprises a first resistor, a second, a diode D1, and a first negative-positive-negative bipolar junction transistor (NPN BJT), the first resistor and the second resistor are connected between a voltage port and ground in series; the diode is connected between the first on-off control pin and a base of the NPN BJT, an emitter of the NPN BJT is grounded, and a collector of the BPN BJT is connected to a connection node of the first resistor and the second resistor.

9. The electronic device according to claim 8, wherein the trigger-receiving sub-circuit comprises a third resistor and a D-flip flop, the D-flip flop comprises an input terminal, an output terminal, and a trigger terminal, the input terminal is connected to the second on-off control pin, the trigger terminal is connected to the connection node of the first resistor and the second resistor, and the third resistor is connected between the input terminal and ground.

10. The electronic device according to claim 9, wherein the switch control sub-circuit comprises a fourth resistor, a fifth resistor, a sixth resistor, a N-channel metal oxide semiconductor field effect transistor (NMOSFET), and a second NPN BJT; a gate of the NMOSFET is connected to the output terminal of the D-flip flop and is grounded via the fourth resistor, the fifth resistor is connected between the voltage port and a drain of the NMOSFET, a source of the NMOSFET is grounded; the drain of the NMOSFET is further connected to a base of the second NPN BJT, an emitter of the second NPN BJT is grounded, the sixth resistor is connected between the power module and a collector of the second NPN BJT.

11. The electronic device according to claim 10, wherein the switch is a P-channel metal oxide semiconductor field effect transistor (PMOSFET), a source and a gate of the PMOSFET are connected to two ends of the sixth resistor, a drain of the PMOSFET is connected to the system power port, the source of the PMOSFET is further connected to the power module.

12. The electronic device according to claim 7, wherein the processing unit further comprises a standby control pin, the processing unit controls the standby control pin to output a standby control signal when determining that the duration of the signal from the power button is less than the first predetermined time but is greater than a second predetermined time and the electronic device is working normally; the power control circuit further comprises a standby control circuit to be connected between the system power port, the function module of the electronic device, and the standby control pin of the processing unit, wherein the standby control circuit is configured to cut off a connection between the system power port and the function module when receiving the standby control signal.

13. The electronic device according to claim 12, wherein the standby control circuit comprises a plurality of MOSFETs; gates of the MOSFETs are all connected to the standby control pin of the processing unit, sources of the MOSFETs are all connected to the system power port, and drains of the MOSFETs are connected to function chips of the function module one by one.

14. The electronic device according to claim 7, wherein the electronic device is a notebook computer, a tablet computer, a desktop computer, or a set top box.

15. A power control circuit for controlling power of an electronic device, the power control circuit comprising:
an on-off control circuit comprising:
a switch to be connected between a power module and a system power port of the electronic device;
a trigger signal producing sub-circuit to be connected to a first on-off control pin of a processing unit of the electronic device, configured to produce an edge trigger signal in response to a signal output by the first on-off control pin is changed from a first control signal to a second control signal;
a trigger-receiving sub-circuit to be connected to a second on-off control pin of the processing unit of the electronic device and the trigger signal producing sub-circuit, configured to follow a signal output by the second on-off control pin and then output the signal of the second on-off control pin when receiving the edge trigger signal from the trigger signal producing sub-circuit, wherein, the second on-off control pin outputs the first control signal, and the trigger-receiving sub-circuit outputs the first control signal when receiving the edge trigger signal; and
a switch control sub-circuit connected between the trigger-receiving sub-circuit and the switch, configured to turn off the switch when receiving the first control signal from the trigger-receiving sub-circuit; and a standby control circuit connected between the system power port, a function module of the electronic device, and a standby control pin of the processing unit; wherein the standby control circuit is configured to cut off a connection between the system power port and the function module when receiving a standby control signal from the standby control pin.

* * * * *